United States Patent
Bae et al.

(10) Patent No.: US 7,345,925 B2
(45) Date of Patent: Mar. 18, 2008

(54) SOFT ERASING METHODS FOR NONVOLATILE MEMORY CELLS

(75) Inventors: Geum-Jong Bae, Gyeonggi-do (KR); Myoung-Kyu Seo, Gyeonggi-do (KR); In-Wook Cho, Gyeonggi-do (KR); Byoung-Jin Lee, Seoul (KR); Jin-Hee Kim, Gyeonggi-do (KR); Myung-Yoon Um, Seoul (KR); Geon-Woo Park, Gyeonggi-do (KR); Sang-Won Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 25 days.

(21) Appl. No.: 11/426,387

(22) Filed: Jun. 26, 2006

(65) Prior Publication Data

US 2007/0036003 A1 Feb. 15, 2007

(30) Foreign Application Priority Data

Aug. 9, 2005 (KR) .................... 10-2005-0072861

(51) Int. Cl.
*G11C 11/34* (2006.01)

(52) U.S. Cl. ..................... 365/185.29; 365/185.18; 365/185.19; 365/185.28

(58) Field of Classification Search .......... 365/185.29, 365/185.18, 185.19, 185.28
See application file for complete search history.

(56) References Cited

U.S. PATENT DOCUMENTS

| 6,236,608 | B1 | 5/2001 | Ratnam | |
|---|---|---|---|---|
| 6,434,053 | B1* | 8/2002 | Fujiwara | 365/185.28 |
| 6,771,540 | B2* | 8/2004 | Satoh et al. | 365/185.18 |
| 7,136,306 | B2* | 11/2006 | Xue et al. | 365/185.28 |

FOREIGN PATENT DOCUMENTS

| JP | 04-105368 | 4/1992 |
|---|---|---|
| JP | 10-261292 | 9/1998 |
| KR | 10-1998-0021579 | 6/1998 |

* cited by examiner

*Primary Examiner*—Tuan T. Nguyen
(74) *Attorney, Agent, or Firm*—Myers Bigel Sibley & Sajovec

(57) ABSTRACT

Erasure methods for a nonvolatile memory cell that includes a gate electrode on a substrate, source and drain regions in the substrate at respective sides of the gate electrode, and a charge storage layer interposed between the gate electrode and the substrate. A nonzero first voltage is applied to the source region starting at a first time. While continuing to apply the first nonzero voltage to the source region, a second voltage having an opposite polarity to the first voltage is applied to the gate electrode starting at a second time later than the first time. The second voltage may increase in magnitude, e.g., stepwise, linearly and/or along a curve, after the second time.

19 Claims, 3 Drawing Sheets

SOFT ERASING METHODS FOR NONVOLATILE MEMORY CELLS

CROSS-REFERENCE TO RELATED APPLICATION

This application claims the benefit of Korean Patent Application No. 10-2005-0072861, filed on Aug. 9, 2005, the contents of which are hereby incorporated herein by reference in their entirety.

BACKGROUND OF THE INVENTION

The present invention relates to semiconductor devices and, more particularly, to erasing methods for nonvolatile memory cells.

Nonvolatile memory devices, unlike volatile memory devices, typically maintain data even when power is not supplied. Accordingly, nonvolatile memory devices, such as flash memory devices, are widely used in, for example, file storage systems, memory cards, portable devices, and other applications.

A nonvolatile memory cell may be programmed by a well-known hot electron injection method. Techniques for erasing a programmed nonvolatile memory cell may vary. For example, an F-N tunneling mechanism or a hot-hole injection mechanism may be used.

A nonvolatile memory cell having a silicon-oxide-nitride-oxide-silicon (SONOS) gate structure may be programmed by inducing hot electron injection like a memory cell having a stacked gate structure. In other words, a high voltage may be applied to a gate electrode to cause an electrical potential difference between a source and a drain. As a result, hot electrons nay be formed in a channel region near the drain (or source), and move over an energy barrier of a tunnel oxide layer to be injected into a charge storage layer, such as a trap dielectric layer. When the electrons are injected into the charge storage layer, a threshold voltage of the device typically increases. Accordingly, when a lower voltage than the increased threshold voltage is applied to the gate electrode, current does not flow in the programmed cell, which may be utilized to read stored data. Electrons within the trap dielectric layer may be erased using a F-N tunneling mechanism, a hot hole injection mechanism, or other technique.

In detail, the charge storage layer, such as the trap dielectric layer, may be a nonconducting layer, so that the electrons injected during the programming operation generally do not freely move in the trap dielectric layer. Accordingly, in order to eliminate the injected electrons, hot holes may be injected in a region equal to a region of the trap dielectric layer where the injected electrons are distributed, or F-N tunneling may occur in the region.

For example, a method of erasing a nonvolatile memory cell using F-N tunneling may erase electrons within the charge storage layer using an electrical potential difference between the gate electrode and the source region to lower the threshold voltage of the cell. In contrast, a method of erasing a nonvolatile memory cell using a hot hole injection technique may involve injecting the hot holes generated between the source region and the substrate into the charge storage layer. However, the erasing speed using F-N tunneling may be very slow, so that the hot hole injection erasing technique has recently gained favor.

A conventional erasing technique for a nonvolatile memory cell is described in Japanese Laid-Open Patent Publication No 1992-105368 entitled "Nonvolatile Semiconductor Storage device" to AJIKA NATSUO et al.

According to AJIKA NATSUO et al, a control gate voltage Vg is set at −12V while a drain voltage Vd is maintained in a floating state during the erasing step. Later, 5V is applied as a source voltage Vs. Such a technique may cause a problem for hot hole injection erasing using hot holes generated by band-to-and tunneling (BTBT). Specifically, when a hot hole injection erasing method is employed in the SONOS-type nonvolatile memory, the voltage applying method according to AJIKA NATSUO et al may cause several problems.

When a source voltage Vs is applied after a gate voltage Vg is applied, the BTBT current may be high due to the hot holes generated by a strong vertical electric field generated by the gate voltage and the source voltage. Even when the gate voltage Vg and the source voltage Vs are simultaneously applied, the BTBT current may be high due to the hot holes generated by a strong vertical electric field generated by the gate voltage and the source voltage. Accordingly, the tunnel oxide layer of the SONOS-type nonvolatile memory cell may be damaged by the high BTBT current. Such damage to the tunnel oxide layer of the SONOS-type nonvolatile memory cell may degrade endurance and retention characteristics of the nonvolatile memory cell. As a result, reliability of the nonvolatile memory device may be degraded.

SUMMARY OF THE INVENTION

Some embodiments of the present invention provide erasure methods for a nonvolatile memory cell that includes a gate electrode on a substrate, source and drain regions in the substrate at respective sides of the gate electrode, and a charge storage layer interposed between the gate electrode and the substrate. A nonzero first voltage is applied to the source region starting at a first time. While continuing to apply the first nonzero voltage to the source region, a second voltage having an opposite polarity to the first voltage is applied to the gate electrode starting at a second time later than the first time. For example, the source and drain regions may be N-type regions, the first voltage may be positive and the second voltage may be negative.

In some embodiments, applying a second voltage having an opposite polarity to the gate electrode starting at a second time later than the first time comprises increasing a magnitude of the second voltage after the second time. For example, in some embodiments, the magnitude of the second voltage may be stepwise increased. In some embodiments, the magnitude of the second voltage may be linearly increased. In further embodiments, the magnitude of the second voltage may be increased along a curve.

In some embodiments, a third voltage having an opposite polarity to the first voltage is applied to the substrate of the nonvolatile memory during application of the first and second voltages. In some embodiments, the substrate is grounded during application of the first and second voltages. In some embodiments, the drain region is grounded or floated during application of the first and second voltages. In further embodiments, a voltage having the same polarity as the first voltage is applied to the drain region during application of the first and second voltages.

Additional embodiments of the present invention provide hot hole injection erasure (HHIE) methods for a nonvolatile memory cell that includes a gate electrode formed on a substrate, N-type source and drain regions in the substrate at respective sides of the gate electrode, and a charge storage layer interposed between the gate electrode and the substrate. A positive voltage is applied to the source region starting at a first time. While continuing to apply the positive voltage to the source region, an increasingly negative voltage is applied to the gate electrode starting at a second time later than the first time. A magnitude of the negative voltage may be increased from the second time until the magnitude of the negative voltage reaches a target voltage magnitude.

In some embodiments, applying an increasingly negative voltage to the gate electrode starting at a second time later than the first time comprises stepwise increasing a magnitude of the negative voltage. In some embodiments, applying an increasingly negative voltage to the gate electrode starting at a second time later than the first time comprises linearly increasing a magnitude of the negative voltage. In further embodiments, applying an increasingly negative voltage to the gate electrode starting at a second time later than the first time comprises increasing a magnitude of the negative voltage along a curve.

In some embodiments, a negative voltage may be applied to the substrate during application of the positive voltage to the source region and the negative voltage to the gate electrode. In other embodiments, the substrate may be grounded during application of the positive voltage to the source region and the negative voltage to the gate electrode. In some embodiments, the drain region may be grounded or floated during application of the positive voltage to the source region and the negative voltage to the gate electrode. In further embodiments, a positive voltage having substantially the same magnitude as the positive voltage applied to the source region may be applied to the drain region during application of the positive voltage to the source region and the negative voltage to the gate electrode.

DETAILED DESCRIPTION

Figure 1:
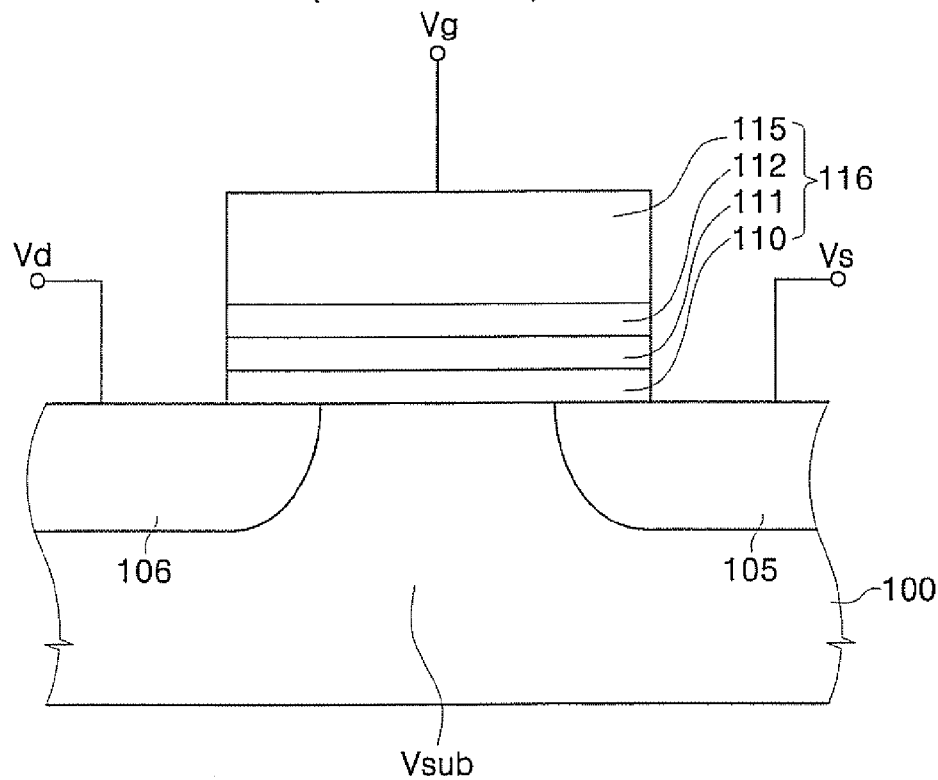
FIG. 1 is a cross-sectional view of a conventional nonvolatile memory cell.

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature, although other materials may be used.

FIG. 1 is a cross-sectional view of a conventional nonvolatile memory cell. Referring to FIG. 1, a gate pattern 116 composed of sequentially stacked layers is formed on a substrate 100. A source region 105 and a drain region 106 are formed within the substrate 100 at respective sides of the gate pattern 116. The gate pattern 116 may be composed of a tunnel oxide layer 110, a charge storage layer 111, and a gate electrode 115, which are sequentially stacked. Further, a blocking insulating layer 112 may be disposed between the gate electrode 115 and the charge storage layer 111. The substrate 100 may be P-type, and the source region 105 and the drain region 106 may be N-type. Hereinafter, it is assumed that the substrate 100 is P-type and the source region 105 and the drain region 106 are N-type. These components may form nonvolatile memory cell that may be included in any of a number of different types of semiconductor devices.

The nonvolatile memory cell may be programmed by a typical conventional technique. For example, when the charge storage layer 111 is a silicon nitride layer or a high-k dielectric layer, which is capable of trapping electrons, the nonvolatile memory cell may be programmed by a conventional hot-electron injection method or F-N tunneling method. As such, when the number of electrons trapped in the charge storage layer 111 increases, a threshold voltage of the nonvolatile memory cell generally increases. Embodiments of the present invention are directed to operations for erasing such a nonvolatile memory cell.

Hereinafter, erasing operations for a nonvolatile memory cell, such as the nonvolatile memory cell shown in FIG. 1, will now be described. FIG. 1 is an exemplary embodiment, and the present invention is not limited thereto. That is, the present invention is not limited to the structure of the nonvolatile memory cell as shown in FIG. 1, but may be applied to various structures of nonvolatile memory cells, such as a local SONOS nonvolatile memory cell.

FIGS. 2 to 6 are voltage-applied waveform diagrams illustrating erasing operations in accordance with various embodiments of the present invention. In FIGS. 2-6, an X axis indicates a function of time, and a Y axis indicates a function of voltage.

Figure 2:
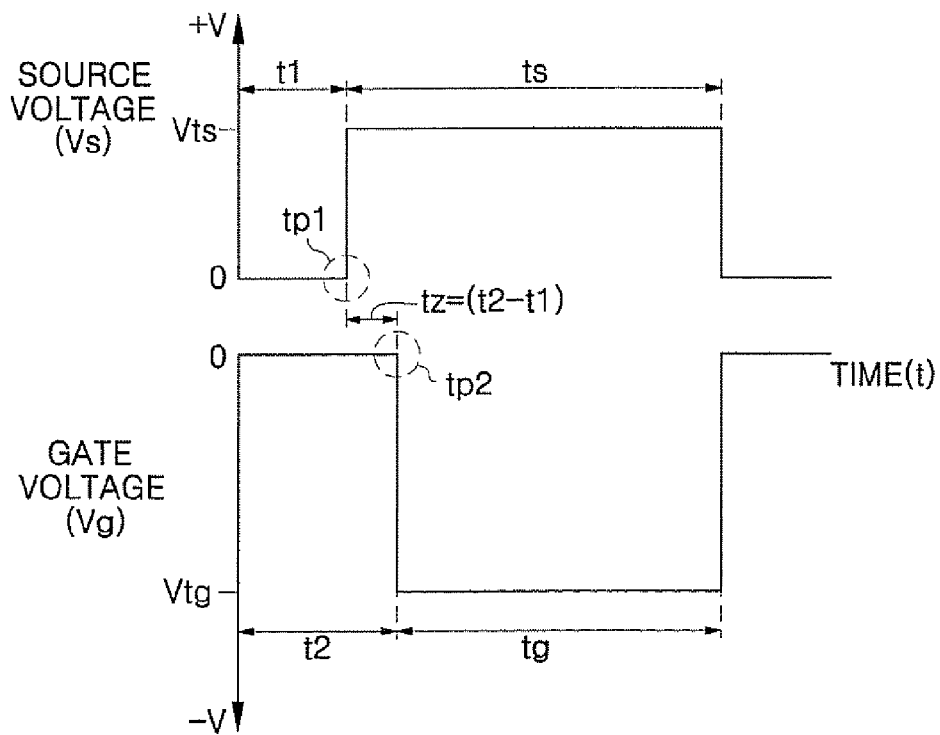
FIG. 2 is a waveform diagram illustrating erasing operations for a nonvolatile memory cell in accordance with some embodiments of the present invention.

Erasing operations according to some embodiments of the present invention will now be described with reference to FIGS. 1 and 2. Referring to FIGS. 1 and 2, a programmed nonvolatile memory cell is provided. The cell may be as described above with reference to FIG. 1, i.e., the programmed nonvolatile memory cell may have a charge storage layer 111 where charges are trapped. The charge storage layer 111 may be a silicon nitride layer or a high-k dielectric layer that is capable of trapping charge. The charges trapped within the charge storage layer 111 may be electrons. Hereinafter, it is assumed that the charges trapped within the charge storage layer 111 are electrons.

Initially, a source voltage Vs applied to the source region 105 is about zero. Specifically, the source voltage Vs applied to the source region 105 is about zero during an interval t1. After the time interval t1 passes, a positive target source voltage Vts is applied to the source region 105 at a time tp1 and is maintained for a time interval ts.

Initially, a gate voltage Vg applied to the gate region 115 is about 0V. Specifically, the gate voltage Vg applied to the gate region 115 is about 0V during a time interval t2. After the time interval t2 passes, a negative target gate voltage Vtg is applied to the gate region 115 at a second point of time tp2, and is maintained for a time interval tg. That is, when the source target voltage Vts is a positive voltage, the gate target voltage Vtg may be a negative voltage. The time t2 is greater than the time t1 by a time difference tz.

A hot hole injection erasing mechanism may be employed. In detail, the source target voltage Vts of +5V to +10V may be applied as the source voltage Vs, and the gate target voltage Vtg of −5V to −10V may be applied as the gate voltage Vg. Hot holes may be generated between the source region 105 and the substrate 100 due to the source target voltage Vts applied as the source voltage Vs. An electrical potential difference between the source target voltage Vts and the gate target voltage Vtg may avoid F-N tunneling while allowing hot hole injection to occur. Such a condition may vary according to the characteristics of the programmed device. Accordingly, each of the source target voltage Vts and the gate target voltage Vtg may depend on the characteristics of the device.

A substrate voltage Vsub applied to the substrate 100 may be a ground state. Alternatively, while the source voltage Vs is applied, the substrate voltage Vsub applied to the substrate 100 may have a different polarity from the source target voltage Vts. In this case, the substrate voltage Vsub may be a negative voltage when the source target voltage Vts is a positive voltage, that is, a positive voltage may be applied to the N-type source region 105 and a negative voltage may be applied to the P-type substrate 100, so that the source region 105 and the substrate 100 may reverse bias a P-N junction therebetween. As such, it is well known in terms of quantum mechanics that hot holes may be generated in a P-N diode to which a reverse bias is applied. That is, the substrate voltage Vsub is applied with a negative voltage, so that more hot holes may be formed between the source region 105 and the substrate 100 in comparison to when the substrate voltage Vsub is a ground state.

As described above, during the time tz between the first point of time tp1 and the second point of time tp2, hot holes are generated between the source region 105 and the substrate 100. Some of the generated hot holes are trapped into the charge storage layer 111, thereby causing a soft erase of some of electrons within the charge storage layer 111. As a result, the threshold voltage Vth of the nonvolatile memory cell may be lowered.

Figure 3:
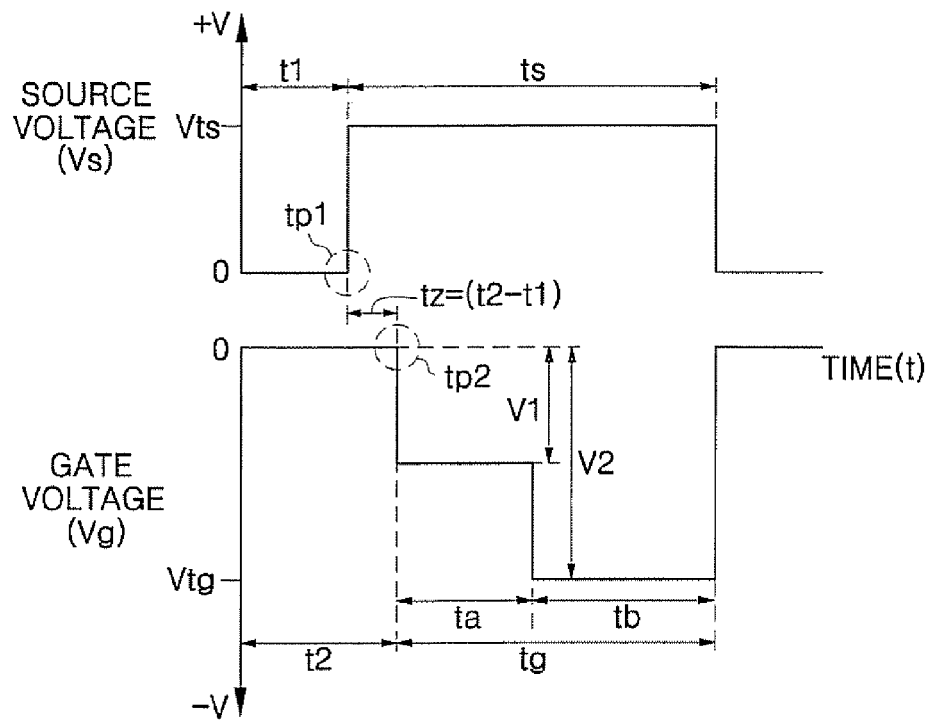
FIG. 3 is a waveform diagram illustrating erasing operations for a nonvolatile memory device in accordance with further embodiments of the present invention.

Erasing operations for a nonvolatile memory cell according to further embodiments of the present invention will now be described with reference to FIGS. 1 and 3. Referring to FIGS. 1 and 3, a negative gate voltage Vtg applied to the gate electrode 115 at time tp2 is applied later than the target source voltage Vts applied to the source region 105 at time tp1 by an amount of time tz. The gate voltage Vg to be applied after the time tp2 may have multiple steps including a first step voltage V1 and a second step voltage V2, i.e., the gate voltage Vg applied at the second time tp2 may be applied with the first step voltage V1 during an erase interval ta, and may be applied with the second step voltage V2 during an erase interval tb after the erase interval ta. The magnitude of the second step voltage V2 may be greater than the magnitude of the first step voltage V1.

After the second time tp2, the nonvolatile memory cell undergoes a soft erase during the interval that the first step voltage V1 is applied as the gate voltage Vg. In detail, while the first step voltage V1 is applied as the gate voltage Vg, hot holes generated between the source region 105 and the substrate 100 are accelerated to be injected into the charge storage layer 111 due to a vertical electric field caused by the first step voltage V1. As a result, the threshold voltage Vth of the nonvolatile memory cell may be lowered. Subsequently, the second step voltage V2 is applied as the gate voltage Vg during the interval tb to complete the erase of the nonvolatile memory cell. In this case, the second step voltage V2 is applied in a state that the threshold voltage of the nonvolatile memory cell is lowered. Accordingly, excess hot hole stress applied to the tunnel oxide layer 110 may be avoided or reduced. As a result, damage to the tunnel oxide layer 110 may be reduced, so that endurance and retention characteristics of the nonvolatile memory cell may be enhanced. Therefore, the reliability of the nonvolatile memory cell may be enhanced.

Figure 4:
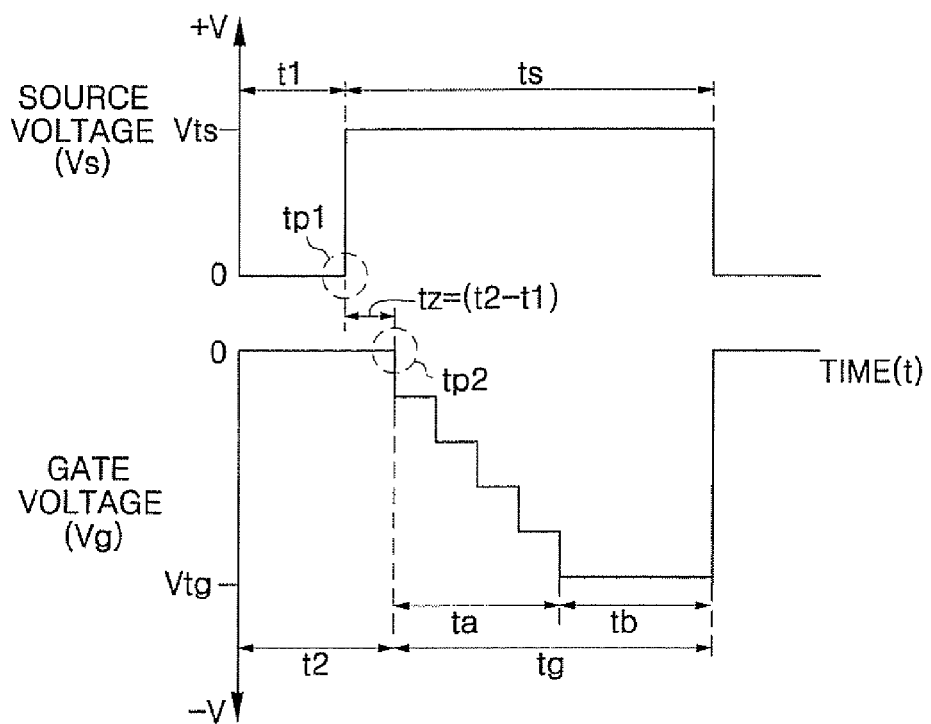
FIG. 4 is a waveform diagram illustrating erasing operations for a nonvolatile memory device in accordance with still further embodiments of the present invention.

The gate voltage Vg applied after the second time tp2 may be applied with additional steps as shown in FIG. 4, i.e., the magnitude of the gate voltage Vg applied during the interval ta after the second point of time tp2 may increase in a stepwise manner. Subsequently, the gate voltage Vg may be applied with the gate target voltage Vtg during the interval tb. The threshold voltage of the device is gradually lowered because the gate voltage Vg increases stepwise as time passes, i.e., the threshold voltage of the device is gradually lowered during the time ta. The gate voltage Vg starts to be applied at the second time tp2 and the magnitude of the gate voltage Vg increases during the time ta, so that gate-induced drain leakage (GIDL) due to the gate voltage Vg may be suppressed. As a result, the reliability of the device may be enhanced.

Figure 5:
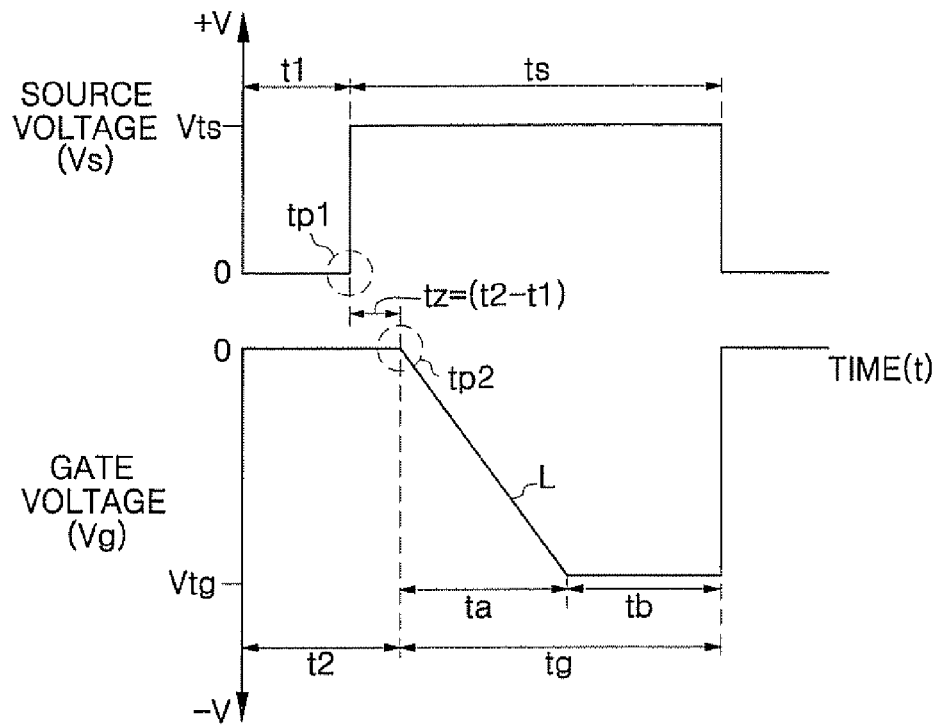
FIG. 5 is a waveform diagram illustrating erasing operations for a nonvolatile memory device in accordance with additional embodiments of the present invention.

Next, erasing operations for a nonvolatile memory cell according to yet other embodiments of the present invention will now be described with reference to FIGS. 1, 5, and 6. Referring to FIGS. 1 and 5, a negative gate voltage Vtg is applied to the gate electrode 115 at a second point of time tp2 that is an interval tz later than a first time tp1 at which the target source voltage Vts applied to the source region 105. After the second time tp2, a magnitude of the gate voltage Vg applied during the time ta linearly increases until it reaches the gate target voltage Vtg. Accordingly, the threshold voltage of the device may decrease as time passes from the second time tp2. Therefore, damage to the tunnel oxide layer 110 due to the excess hot hole stress may be reduced.

Figure 6:
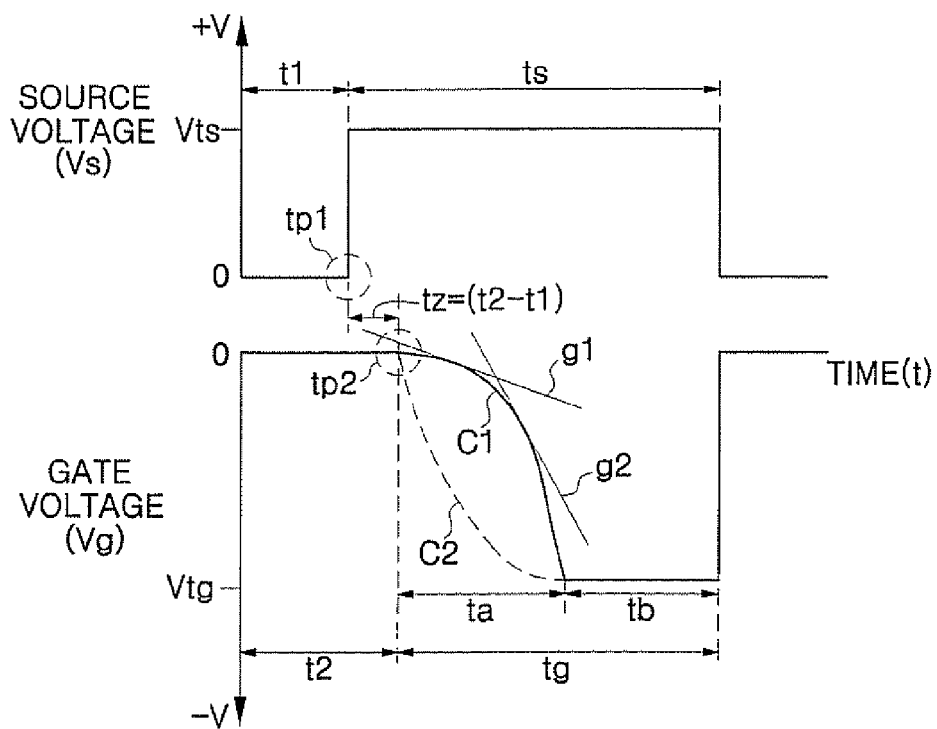
FIG. 6 is a waveform diagram illustrating erasing operations for a nonvolatile memory device in accordance with further embodiments of the present invention.

In further embodiments shown in FIG. 6, the magnitude of the gate voltage Vg may increase along various curves C1 and C2 during the interval ta starting at the time tp2. The gate voltage Vg may vary with different gradients. For example, the gate voltage Vg may follow the first curve C1 where the gradient of the first curve C1 increases during the interval ta. In detail, the gate voltage Vg may have a first gradient g1 and a second gradient g2 after the time tp2. In this case, a magnitude of the second gradient g2 may be greater than a magnitude of the first gradient g1. As a result, after the time tp2, the gate voltage Vg may gradually increase with a smaller gradient and then increase with a greater gradient during the time ta. Subsequently, the gate voltage Vg may be increased during the time ta and then maintained at the gate target voltage Vtg during the time tb.

Alternatively, the gate voltage Vg may follow the second curve C2 where a magnitude of a gradient of the second curve-type inclination C2 decreases during the time ta from the time tp2. In the embodiments of the present invention described with reference to FIGS. 3 to 6, the time tb in each of the figures indicates the time when the maximum magnitude of the gate voltage Vg, i.e., the gate target voltage Vtg is applied. The time tb may vary according to the characteristics of the device. For example, the gate voltage Vg applied after the second point of time tp2 may be applied to make the magnitude of the gate voltage Vg increase during the time tg.

According to some embodiments of the present invention described above, a gate voltage Vg is applied later than a source voltage Vs. Further, the magnitude of the gate voltage Vg may be increased until it reaches a target voltage Vtg magnitude. The gate voltage Vg may be applied in various ways, so that the gate voltage Vg may be prevented from being applied faster than the source voltage Vs or simultaneously applied with the source voltage. As a result, the source voltage Vs may be applied faster than the gate voltage Vg, thereby obtaining a soft erase effect. Furthermore, the gate voltage Vg may be applied later than the source voltage Vs, and the magnitude of the gate voltage Vg may be gradually increased such that a threshold voltage of the device may be gradually lowered. In particular, when the erase operation is carried out by the hot hole injection erase mechanism, hot hole stress damage to a tunnel oxide layer may be reduced. As a result, the endurance and retention characteristics of the nonvolatile memory cell may be improved. Therefore, the reliability of the nonvolatile memory cell may be enhanced.

It will be apparent to those skilled in the at that various modifications and variations can be made in the present invention. Thus, it is intended that the present invention covers the modifications and variations of this invention provided they come within the scope of the appended claims and their equivalents.

What is claimed is:

1. An erasure method for a nonvolatile memory cell that includes a gate electrode on a substrate, source and drain regions in the substrate at respective sides of the gate electrode, and a charge storage layer interposed between the gate electrode and the substrate, the method comprising;

applying a nonzero first voltage to the source region starting at a first time; and while continuing to apply the first voltage to the source region, applying a second voltage having an opposite polarity to the first voltage to the gate electrode starting at a second time later than the first time.

2. The method of claim 1, wherein applying a second voltage having an opposite polarity to the first voltage to the gate electrode starting at a second time later than the first time comprises increasing a magnitude of the second voltage after the second time.

3. The method of claim 2, wherein increasing a magnitude of the second voltage after the second time comprises stepwise increasing the magnitude of the second voltage.

4. The method of claim 2, wherein increasing a magnitude of the second voltage after the second time comprises linearly increasing the magnitude of the second voltage.

5. The method of claim 2, wherein increasing a magnitude of the second voltage after the second time comprises increasing the magnitude of the second voltage along a curve.

6. The method according to claim 1, further comprising applying a third voltage having an opposite polarity to the first voltage to the substrate of the nonvolatile memory during application of the first and second voltages.

7. The method of claim 1, further comprising grounding the substrate during application of the first and second voltages.

8. The method of claim 1, further comprising grounding or floating the drain region during application of the first and second voltages.

9. The method of claim 1, further comprising applying a third voltage having the same polarity as the first voltage to the drain region during application of the first and second voltages.

10. The method of claim 1, wherein the source and drain regions are N-type regions, and wherein the first voltage is positive and the second voltage is negative.

11. A hot hole injection erasure (HHIE) method for a nonvolatile memory cell that includes a gate electrode formed on a substrate, N-type source and drain regions in the substrate at respective sides of the gate electrode, and a charge storage layer interposed between the gate electrode and the substrate, the method comprising:

applying a positive voltage to the source region starting at a first time; and while continuing to apply the positive voltage to the source region, applying an increasingly negative voltage to the gate electrode starting at a second time later than the first time.

12. The method of claim 11, wherein applying an increasingly negative voltage to the gate electrode starting at a second time later than the first time comprises increasing a magnitude of the negative voltage from the second time until the magnitude of the negative voltage reaches a target voltage magnitude.

13. The method of claim 11, wherein applying an increasingly negative voltage to the gate electrode starting at a second time later than the first time comprises stepwise increasing a magnitude of the negative voltage.

14. The method of claim 11, wherein applying an increasingly negative voltage to the gate electrode starting at a second time later than the first time comprises linearly increasing a magnitude of the negative voltage.

15. The method of claim 11, wherein applying an increasingly negative voltage to the gate electrode starting at a second time later than the first time comprises increasing a magnitude of the negative voltage along a curve.

16. The method of claim 11, further comprising applying a negative voltage to the substrate during application of the positive voltage to the source region and the negative voltage to the gate electrode.

17. The method of claim 11, further comprising grounding the substrate during application of the positive voltage to the source region and the negative voltage to the gate electrode.

18. The method of claim 11, further comprising grounding or floating the drain region during application of the positive voltage to the source region and the negative voltage to the gate electrode.

19. The method of claim 11, further comprising applying, to the drain region, a positive voltage having substantially the same magnitude as the positive voltage applied to the source region starting at the first time.

* * * * *